United States Patent [19]
Horiguchi et al.

[11] Patent Number: 5,402,376
[45] Date of Patent: * Mar. 28, 1995

[54] SEMICONDUCTOR MEMORY HAVING REDUNDANCY CIRCUIT

[75] Inventors: Masashi Horiguchi, Kawasaki; Jun Etoh, Hachioji; Masakazu Aoki, Tokorozawa; Yoshinobu Nakagome, Hachioji; Hitoshi Tanaka, Tachikawa; Kiyoo Itoh, Higashikurume, all of Japan

[73] Assignees: Hitachi, Ltd.; Hitachi VLSI Engineering Corp., both of Tokyo, Japan

[*] Notice: The portion of the term of this patent subsequent to Jul. 16, 2010 has been disclaimed.

[21] Appl. No.: 103,781

[22] Filed: Aug. 10, 1993

Related U.S. Application Data

[63] Continuation of Ser. No. 789,024, Nov. 6, 1991, Pat. No. 5,262,993.

[30] Foreign Application Priority Data

Nov. 16, 1990 [JP] Japan ................. 2-308739

[51] Int. Cl.$^6$ ................. G11C 7/00; G11C 29/00
[52] U.S. Cl. ................. 365/200; 365/230.03; 365/230.06
[58] Field of Search ................. 365/200, 230.03, 230.06

[56] References Cited

U.S. PATENT DOCUMENTS

| | | | |
|---|---|---|---|
| 3,755,791 | 8/1973 | Arzubi ................. | 365/200 |
| 4,688,219 | 8/1987 | Takemae ................. | 365/200 |
| 4,727,516 | 2/1988 | Yoshida et al. ................. | 365/200 |
| 4,750,158 | 6/1988 | Giebel et al. ................. | 365/200 |
| 4,783,781 | 11/1988 | Awaya ................. | 365/200 |
| 4,796,233 | 1/1989 | Awaya et al. ................. | 365/200 |
| 5,193,071 | 3/1993 | Umina et al. ................. | 365/200 |
| 5,262,993 | 11/1993 | Horiguchi et al. ................. | 365/200 |

OTHER PUBLICATIONS

Kokkonen, et al., "Memories and Redundancy Techniques", ISSCC Digest of Technical Papers, pp. 80-81, Feb. 1981.

Egawa, et al., "1-Mbit Full-Wafer MOS RAM", IEEE Journal of Solid State Circuits, vol. SC-15, No. 4, pp. 677-686, Aug. 1990.

MacDonald, et al., "Dynamic RAMs—200 Mbit Wafer Memory", ISSCC Digest of Technical Papers, pp. 240-241, Feb. 1989.

*Primary Examiner*—Do Hyun Yoo
*Attorney, Agent, or Firm*—Antonelli, Terry, Stout & Kraus

[57] ABSTRACT

In a semiconductor memory, switch circuits are provided so as to inhibit voltage and signal supplies to each of the normal memory blocks when so required. On the other hand, a ROM is provided on the chip so as to store the address of a defective memory block which consumes an excessively large stand-by current when the semiconductor memory is in the stand-by mode. The switch circuits are controlled by the output of the ROM so as to inhibit the voltage and signal supply to the defective memory block. Then, a spare memory block which is substituted for the defective normal memory block receives the voltage and signal supply.

23 Claims, 11 Drawing Sheets

SEMICONDUCTOR MEMORY HAVING REDUNDANCY CIRCUIT

This is a continuation of application Ser. No. 07/789,024, filed Nov. 6, 1991, now U.S. Pat. No. 5,262,993.

BACKGROUND OF THE INVENTION

The present invention relates to a semiconductor memory comprising means for substituting a spare memory block for a normal memory block when the latter is found defective, so as to deal with the defect. More particularly, the present invention relates to a semiconductor memory which can also be used as a general-purpose memory and which is suitable to efficiently deal with or repair a defect or failure as described above.

Redundancy techniques are widely used as an effective means for improving the yield rate of and reducing the manufacturing costs of semiconductor memories. These techniques are described in, for example, the following papers:

(1) ISSCC, Digest of Technical Papers, pp. 80–81, February 1981;
(2) IEEE, Journal of Solid-State Circuits, Vol. SC-15, No. 4, pp. 677–686, August 1981; and
(3) ISSCC, Digest of Technical Papers, pp. 240–241, February 1989.

The redundancy technique described in the paper (1) is now most usually used for semiconductor memories. That is, a spare word line or a spare bit line provided beforehand on the chip of a semiconductor memory is used to substitute a word line or a bit line including a defective memory cell. On the other hand, the paper (2) proposes to use a larger block unit for substitution. That is, this paper relates to the so-called full-wafer scale integration in which an entire wafer is integrated into a single memory. The paper (3) relates also to the full-wafer scale integration. However, according to the proposed method therein, a defective memory cell is not targeted for substitution, and the memory system which is composed on the wafer isolates such a defective memory chip on the wafer.

One of the problems of the prior art redundancy techniques described above is that it is unable to remedy a failure (referred to hereinafter as a DC failure) where the chip consumes an excessively large current, especially in the stand-by mode. Because a chip where the stand-by current is larger than a specified value must be discarded as a reject, this DC failure is a great obstacle for the desired improvement in the yield rate of semiconductor memories. This DC failure is attributable to various causes, and that which will occur in a memory array of, for example, a DRAM will be described now with reference to FIG. 11.

FIG. 11 is an equivalent circuit diagram of a memory array and a sense circuit of a DRAM using conventional memory cells of one transistor/one capacitor type. Memory cells MC are arrayed at the intersections of word lines W and data line pairs D and $\overline{D}$. P designates a plate (an opposite electrode of the capacitor in each memory cell). A sense circuit 11 includes a sense amplifier 110 amplifying a signal voltage on the data lines and a precharge circuit 111 used for initially setting the data line potential. The potential at each node is as follows when this memory is in its stand-by mode. First, all of the word lines W are not selected, and their potential is fixed at the ground potential (OV). The data lines D and $\overline{D}$ are connected to a source of a DC voltage $V_{MP}$ through the precharge circuit 111 and a power supply line 115. The plate P is connected to a source of a DC voltage $V_{PL}$ by a power supply line 105. In a modern DRAM, the values of the DC voltages $V_{MP}$ and $V_{PL}$ are usually selected to be $\frac{1}{2}$ of the power supply voltage $V_{cc}$.

Suppose now that a short-circuit occurs between the word line W and the data line D as shown at 108. Because of such a defect, the current from the voltage source $V_{MP}(=V_{cc}/2)$ flows to the ground through the precharge circuit 111, the data line D and the word line W. On the other hand, when a short-circuit occurs between the word line Wi and the plate P as shown at 109, the current from the voltage source $V_{PL}(=V_{cc}/2)$ flows to the ground through the plate P and the word line Wi. In each of these cases, an excessively large direct current flows in the stand-by mode. These failures cannot be remedied by the prior art redundancy techniques. This is because, even when the defective word and data lines W and D are substituted by a spare word line and a spare data line respectively so that they may not be selected, the current paths described above still remain in the memory placed in the stand-by mode.

The paper (3) cited above proposes to turn off the power supply switch for such a defective chip. It is true that the DC failure can be remedied by turning off the power supply switch. However, the method proposed in the paper (3) has the problems which will be described now. Firstly, a ROM for storing the position of such a defective chip is additionally required as an external circuit of the wafer. Secondly, because the defective memory chip is isolated, the usable capacity of the memory is not fixed and is dependent on the number and distribution of the defective chips. For these reasons, the proposed method is not applicable to fabrication of general-purpose memories such as DRAMs and SRAMs, and its application is limited. Also, the control circuit requires a large circuit scale (resulting in about a 20% increase in the chip area), and increased power consumption is also required.

SUMMARY OF THE INVENTION

The present invention provides a semiconductor memory which comprises, as, for example, shown in FIG. 1, a plurality of normal memory blocks, a plurality of spare memory blocks, addressing means for generating address signals for selecting the normal memory blocks, a ROM for storing the address of a defective one of the normal memory blocks, comparing means for comparing the output of the ROM with the address signals, switch means associated with the normal memory blocks for permitting or inhibiting the power and signal supplies to each of the memory blocks according to the output of the ROM and the address signals, and switch means associated with the spare memory blocks for permitting or inhibiting the power and signal supplies to each of the memory blocks according to the output of the ROM and the output of the comparing means.

Thus, the power and signal supplies to each of the normal memory blocks can be inhibited by the associated switch means. The ROM for storing the address of the memory block having the DC failure is provided on the chip. The output of the ROM is used to control the switch means so as to inhibit the power and signal supplies to the defective memory block. In lieu of the defective memory block, the power and signals are now supplied to the spare memory block.

The switch means associated with the normal memory blocks preferably includes first decoding means for decoding the output of the ROM, second decoding means for decoding the address signals, and switch circuits controlled by the first and second decoding means.

Further, the memory cell is preferably a dynamic memory cell of one transistor/one capacitor type, and the switch means provided for the normal and spare memory blocks preferably permit or inhibit at least the plate voltage supply, the data line precharge voltage supply and the data line precharge signal supply to the memory cells.

In the present invention, the power and signal supplies to each of the normal memory blocks can be stopped by the associated switch circuits. Therefore, in the the case where the semiconductor memory is placed in the stand-by mode and one of the normal memory blocks becomes defective, not only the signal supply but also the power supply to the memory block not in use can be stopped. This eliminates unnecessary power consumption.

Thus, when the power and signal supplies to a defective normal memory block are inhibited, and a spare memory block is used in lieu of the defective one, a DC failure which could not be remedied according to the prior art redundancy techniques can now thus be remedied. Further, by inhibiting the signal supply to the defective memory block, unnecessary current consumption can be minimized.

In the present invention, the ROM provided on the chip controls the switch-over of the power and signal supplies, so that an additional external control circuit need not be provided.

Therefore, the means used in the present invention can be applied to general-purpose memories.

It is an object of the present invention to solve the prior art problems described above and to provide a semiconductor memory having a redundancy circuit, which can be used as a general-purpose memory and in which a DC failure can be efficiently remedied.

These objects and many of the attendant advantages of the present invention will become better understood by reference to the following detailed description when considered in connection with the accompanying drawings.

DESCRIPTION OF THE PREFERRED EMBODIMENTS

Figure 1:
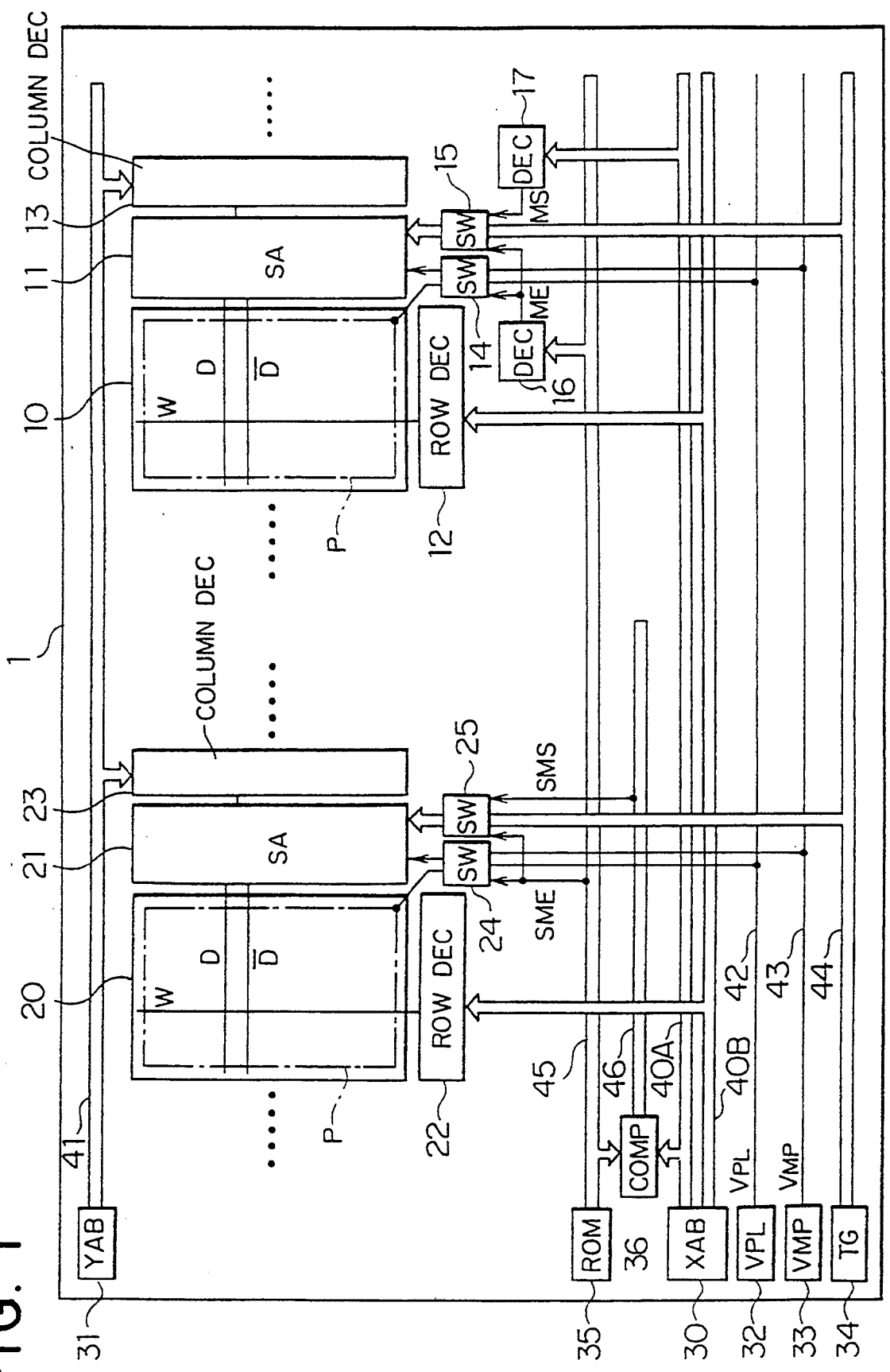
FIG. 1 is a block diagram showing the structure of an embodiment of the semiconductor memory according to the present invention.

The embodiments of the present invention will now be described in detail with reference to the accompanying drawings.

In the embodiments which will now be described, various parts are designated respectively by the following reference numerals:

1: Semiconductor chip
10, 10L, 10R: Normal memory mat
20, 20L, 20R: Spare memory mat
11, 21: Sense circuit
12, 12L, 12R, 22, 22L, 22R: Row decoder
13, 23: Column decoder
14, 15, 24, 25: Switch circuit
16, 17, 16L, 16R, 17L, 17R: Decoder circuit
18: Sense amplifier drive circuit
30: Row address buffer
31: Column address buffer
32: Plate voltage supply circuit
33: Data line precharge voltage supply circuit
34: Timing signal generator circuit
36: Comparator circuit
37: Decoder
110: Sense amplifier
111: Data line precharge circuit
116L, 116R: Transfer gate The first embodiment of the present invention will now be described with reference to the drawings. In the following description, the redundancy technique according to the present invention is applied to a DRAM (a dynamic random access memory), especially a DRAM using memory cells of one transistor/one capacitor type. However, it is apparent that the present invention is also applicable to another semiconductor memory such as an SRAM (a static random access memory), an EPROM (an erasable programmable read-only memory) or an EEPROM (a electrically erasable programmable read-only memory). Also, the semiconductor memory specifically described herein is of the type using the CMOS technology. However, the present invention is also applicable to another semiconductor memory using another technology, such as, a unipolar MOS transistor, a bipolar transistor or their combinations.

FIRST EMBODIMENT

Figure 10:
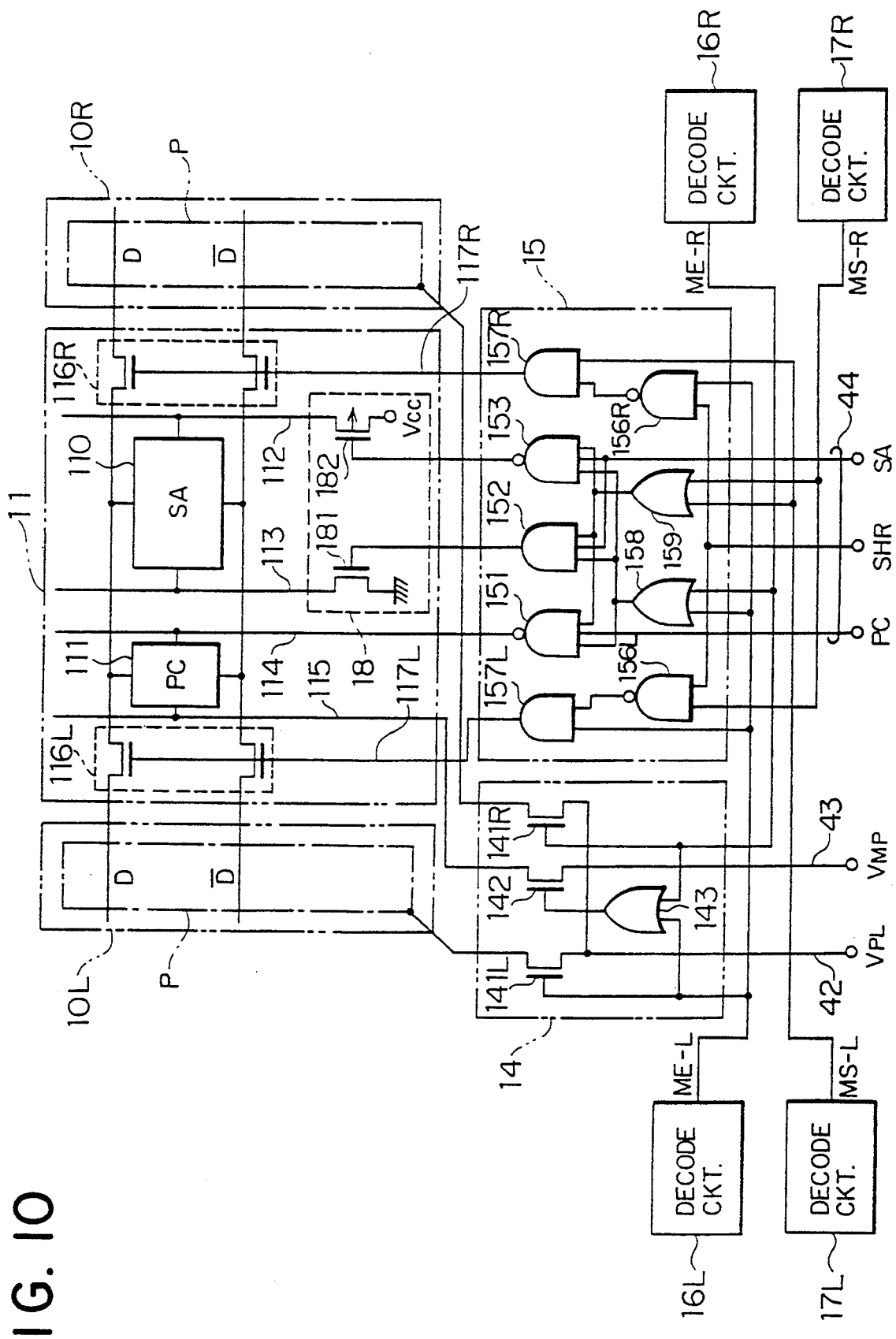
FIG. 10 is a circuit diagram of element circuits of the third embodiment of the present invention.

FIG. 1 shows a first embodiment of the present invention, that is an application of the present invention to a DRAM. In FIG. 1, 10 and 20 designate memory mats where memory cells are disposed at the intersections of word lines W and data line pairs D and $\overline{D}$. More precisely, 10 designates a normal memory mat, while 20 designates a spare memory mat. Although only one normal memory mat 10 and only one spare memory mat 20 are shown in FIG. 1, it is apparent that there are M normal memory mats 10 and R spare memory mats 20 (each of M and R: an integer larger than and including 2). Sense circuits 11 and 21 amplify signals appearing on the data lines. Row decoders 12 and 22 select the word lines, and column decoders 13 and 23 select the data lines. Switch circuits 14 and 24 supply required power to the associated memory mats, and switch circuits 15 and 25 supply signals to the associated memory mats. Decoder circuits 16 and 17 control the switch circuits 14 and 15, respectively.

The semiconductor memory includes a row address buffer 30 and a column address buffer 31. The row address buffer 30 generates a first output signal of m (=log₂M) bits 40A and a second output signal of remaining bits 40B. The first signal selects or specifies a memory mat and will be referred to hereinafter as an inter-mat address signal, while the second signal specifies the word line in the selected memory mat and will be referred to hereinafter as a inter-mat address signal. A ROM 35 stores the inter-mat address of a memory mat having a DC failure, and a comparator circuit 36 compares the output of the ROM 35 with the inter-mat address signal generated from the address buffer 30. A memory-cell plate voltage $V_{PL}$ is generated from a power supply circuit 32, and a data line precharge voltage $V_{MP}$ is generated from a power supply circuit 33. A timing signal generator circuit 34 generates a timing signal group for driving the sense circuits 11 and 21. Data input and output circuits are not shown in FIG. 1.

The defect repairing (remedying) operation of the semiconductor memory of the present invention will now be described.

The essential parts playing the defect remedying function are the switch circuits 14, 15, 24, 25, and the decoder circuits 16, 17. The switch circuits 14 is turned on when a mat enable signal ME is in its logic level "1", the switch circuit 15 is turned on when both the mat enable signal ME and a mat select signal MS are in their logic level "1", the switch circuit 24 is turned on when a spare mat enable signal SME is in its logic level "1", and the switch circuit 25 is turned on when both the spare mat enable signal SME and a spare mat select signal SMS are in their logic level "1". The decoder circuit 16 receives the output 45 of the ROM 35 (which stores the inter-mat address of a defective memory mat) and decides whether or not the specific memory mat is defective. When the result proves that the specific memory mat is defective, the signal ME, which is the output of the decoder circuit 16, is turned into its logic level "0", while when the result proves that the specific memory mat is not defective, the signal ME remains in its logic level "1". The intermat address signal 40A is applied to the decoder circuit 17. When this signal 40A represents the address of the specific memory mat, the signal MS, which is the output of the decoder circuit 17, remains in its logic level "1". Otherwise, the signal MS is turned into its logic level "0".

One normal memory met 10 is now noted, and the operation will be described when the memory mat 10 is defect-free. In this case, the output signal ME of the decoder circuit 16 is in its logic level "1", and the switch circuit 14 is in its on state. As a result, the voltages $V_{PL}$ and $V_{MP}$ are supplied to the memory mat 10. As soon as the memory is placed in operation, the address buffer 30 generates the address signals 40A and 40B. The intermat address signal 40A is decoded by the decoder circuit 17. The output signal MS of logic level "1" appears from the decoder circuit 17 when the memory mat 10 is selected, while the signal MS of logic level "0" appears when the memory mat 10 is not selected. Thus, when the memory mat 10 is selected, the switch circuit 15 is turned on, and the timing signals are applied to the selected memory mat 10. On the other hand, when this memory mat 10 is not selected, no timing signals are applied. Also, because the spare mat enable signal SME is in its logic level "0", the voltages and timing signals are not applied to the spare memory mat 20.

Suppose then the case where a DC failure has occurred on the normal memory mat 10, and this mat 10 is substituted by the spare memory mat 20. In this case, the inter-mat address of the memory mat 10 is written in the ROM 35. As a result, the mat enable signal ME for the normal memory mat 10 is in its logic level "0", while the mat enable signal SME for the spare memory mat 20 is now in its logic level "1". Therefore, the voltages $V_{PL}$ and $V_{MP}$ are not supplied to the normal memory mat 10 from the circuits 32 and 33 and are now supplied to the spare memory mat 20. When the memory is placed in operation, the mat select signal MS is in its logic level "1" when the memory mat 10 is selected, but in its logic level "0" when the memory mat 10 is not selected. However, because the mat enable signal ME for the memory mat 10 is in its logic level "0", and the switch circuit 15 is in its off state, the timing signals are not applied to the memory mat 10 even when this memory mat 10 is selected. On the other hand, the intermat address signal generated from the row address buffer 30 is compared in the comparator circuit 36 with the output signal of the ROM 35. When the input address coincides with the address of memory mat 10, the spare mat select signal SMS of logic level "1" appears from the comparator circuit 36. As a result, the switch circuit 25 associated with the spare memory mat 20 is turned on to supply the timing signals to the spare memory mat 20.

The details of the element circuits of this first embodiment will now be described with reference to FIGS. 2 to 7.

Figure 2:
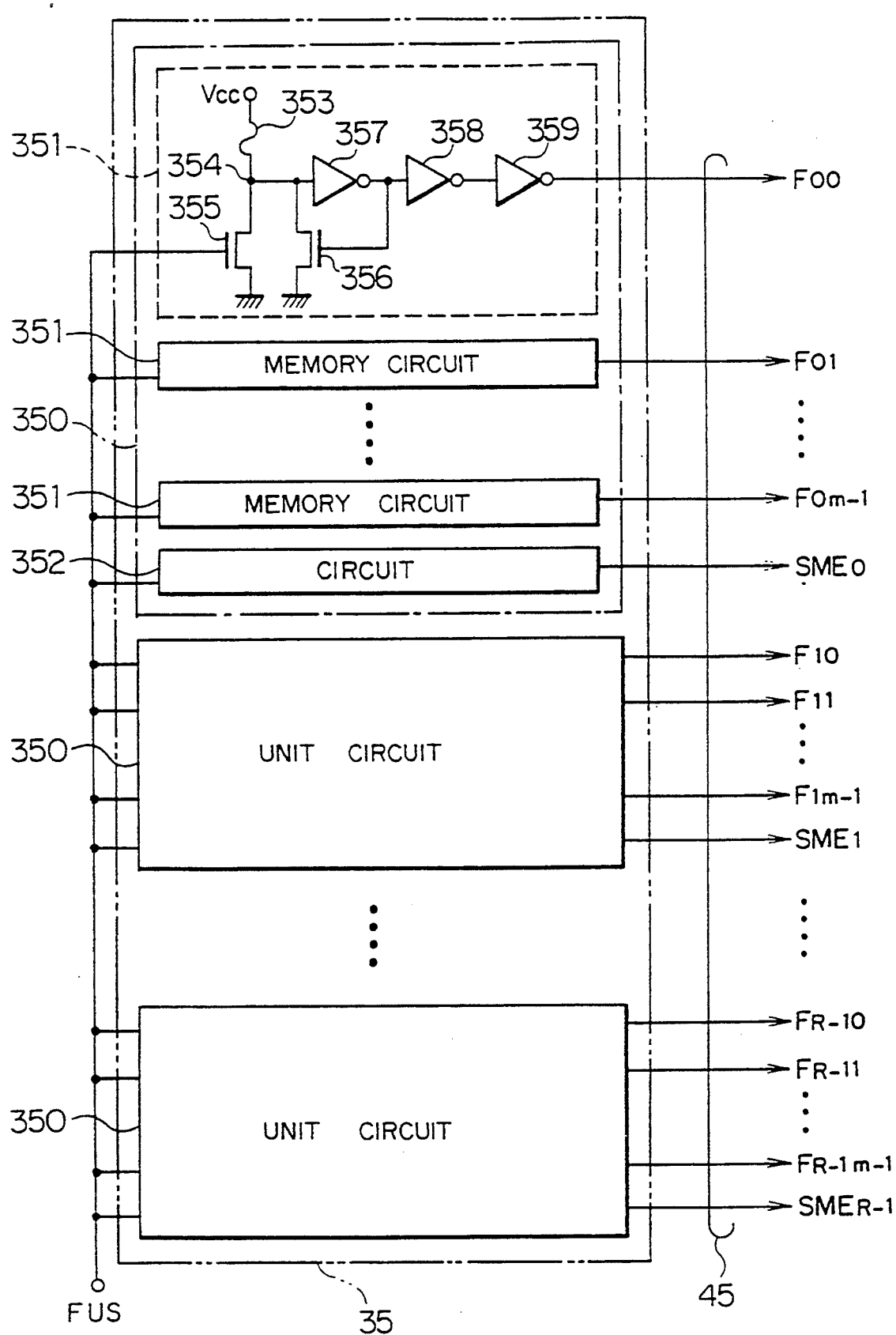
FIGS. 2 to 7 are circuit diagrams of element circuits of the embodiment of the present invention shown in FIG. 1.

FIG. 2 shows the structure of one form of the ROM 35 used in the embodiment. In FIG. 2, 350 designates a unit circuit for storing one inter-mat address. There are a total of R unit circuits 350 each of which corresponds to one spare memory mat 20. The number of bits of the intermat address is m. Therefore, each unit circuit 350 consists of a 1-bit memory circuits 351 and a circuit 352 generating the spare mat enable signal SME. (The structure of this circuit 352 is the same as that of the circuit 351.) The circuit 351 includes, as a memory device, a fuse 353 which is blown by a laser beam. Before the fuse 353 is cut, a high level is maintained at a node 354, and the output F is in its low level, that is, in its logic level "0". At this time, a MOSFET 356 is not conducting.

When the fuse 353 is blown, the node 354 is placed in its low level, and the output F is turned into its high level, that is, into its logic level "1". The MOSFET 356 becomes conducting and maintains the node 354 at its low level. Another MOSFET 355 is provided so that the node 354 can be surely maintained at its low level after the fuse 353 is blown. A signal FUS, that is turned into a high level immediately after the voltage supply or at suitable timing (for example, once in each cycle) is preferably applied to the gate of the MOSFET 355.

When a spare memory mat 20 is to be substituted for a defective normal memory mat 10, the address of the defective memory mat 10 is stored in the unit circuit 350 corresponding to the spare memory mat 20 used for substitution, in a manner which will be described now. First, the fuse 353 in the circuit 352 is blown. As a result, the spare memory mat enable signal SME of logic level "1" appears from the circuit 352. Whether the fuse 353 in each circuit 351 is to be blown or not is determined on the basis of the intermat address of the normal memory mat 10. For example, the fuse is blown when the intermat address bit is a "1", while the fuse is not blown when the intermat address bit is a "0". (Of course, the relation may be inverse to that described above.) Only the output F from the circuit 351, where the fuse 353 is cut, has the logic level "1". When plural normal memory mats 10 are found defective, the addresses of the defective normal memory mats 10 are to be written in the respective circuits 350.

The memory device is in no way limited to the fuse blown by a laser beam as described above. The device may be an electrically blown fuse or a non-volatile memory such as an EPROM.

Figure 3:
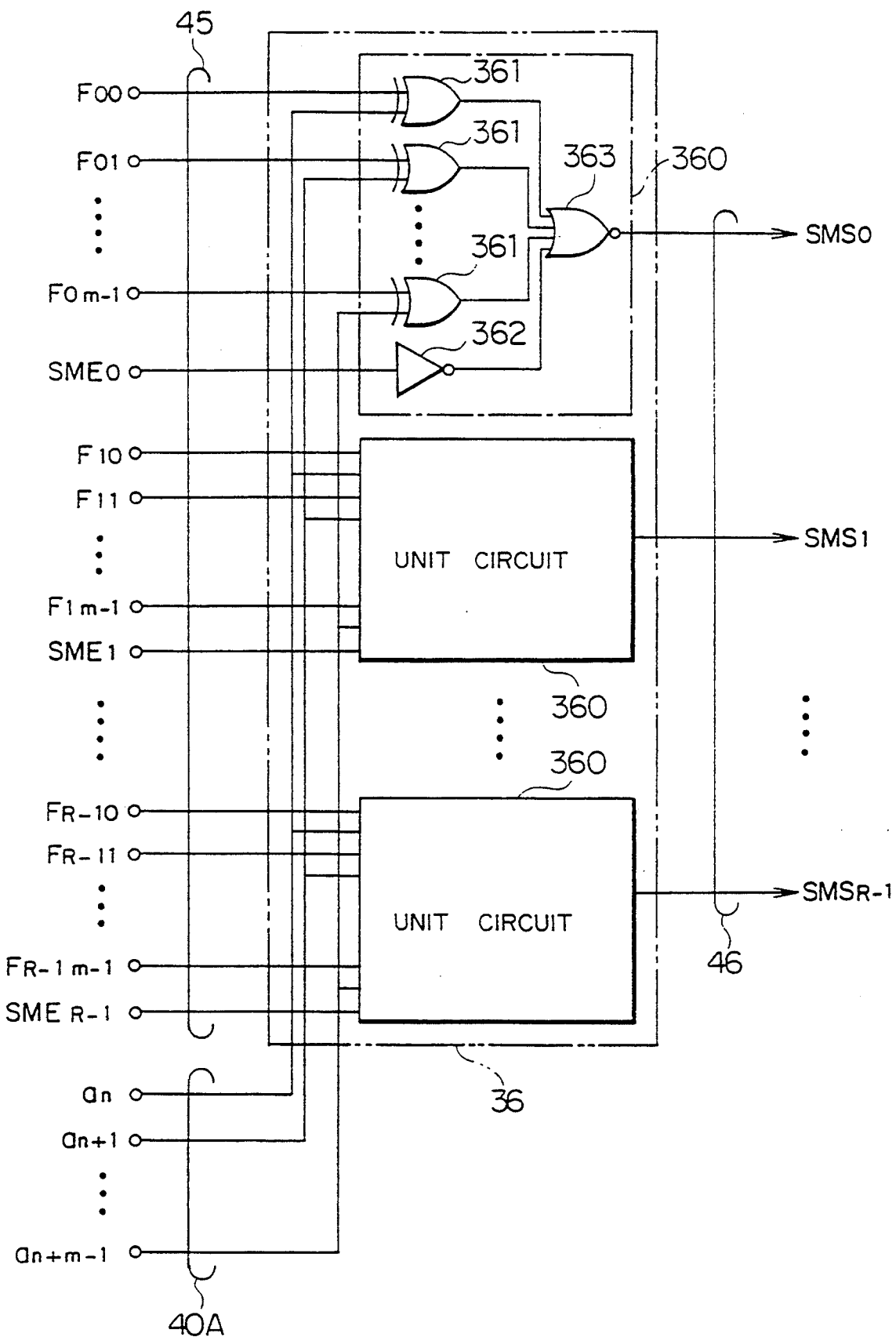

FIG. 3 shows the structure of one form of the comparator circuit 36. In FIG. 3, 360 designates a unit circuit for comparing the output of the ROM 35 with the intermat address signal. There are a total of R circuits 360 each of which corresponds to one spare memory mat 20. The circuit 360 consists of m exclusive-OR gates 361, one inverter 362 and one NOR gate 363. The output (the spare memory mat select signal SMSi) of the circuit 360 has the logic level "1" only when the output $F_{ij}$ of the ROM 35 completely coincides with the address signal $a_{n+j}$ (j=0~m−1), and the spare mat enable signal is SMEi="1". The structure of the comparator circuit 36 is in no way limited to that shown in FIG. 3, and another logically equivalent circuit may be substituted.

Figure 4:
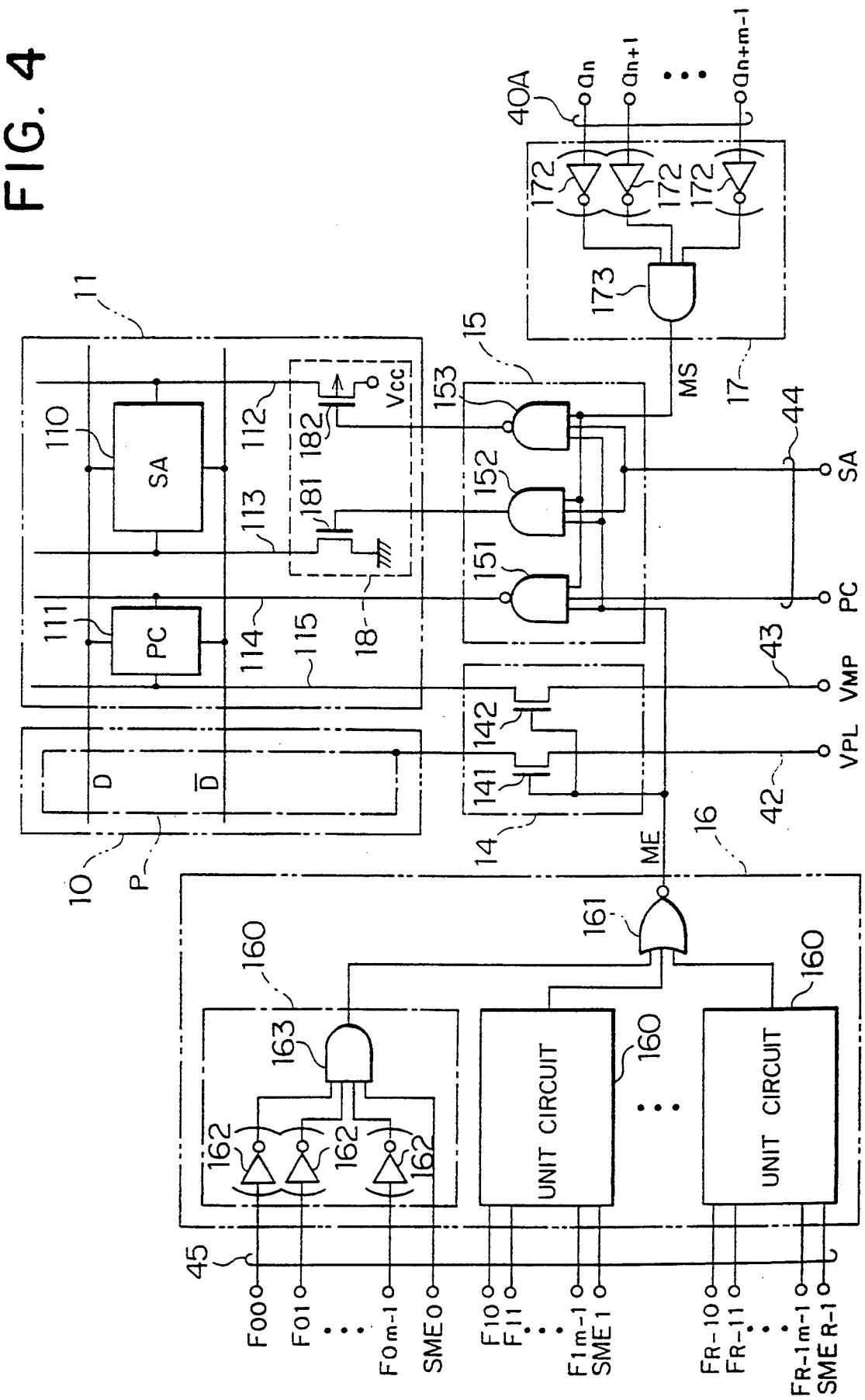

FIG. 4 shows one form of the structures of the switch circuits 14, 15 and the decoder circuits 16, 17 associated with the normal memory mat 10. The decoder circuit 16 consists of R unit circuits 160 and one NOR gate 161. Each unit circuit 160 decodes one of the address signals $F_{io}$ to $F_{im-1}$ generated from the ROM 35 and consists of corresponding inverters 162 and one AND gate 163. The inserted position of the inverters 162 is determined by the intermat address of the associated normal memory mat 10. When the address given by one of the address signals $F_{io}$ to $F_{im-1}$ coincides with the address of the specific memory mat 10, and the spare mat enable signal is SMEi="1", the output from the AND gate 163 is in the logic level "1", and the output (the memory mat enable signal ME) of the NOR gate 161 is in its logic level "0". When none of the R addresses $F_{io}$ to $F_{im-1}$ (i=0~R−1) does not coincide with the address of the specific memory mat 10, the memory mat enable signal ME has its logic level "1".

The decoder circuit 17 decodes intermat address signals $a_n$ to $a_{n+m-1}$, and consists of corresponding inverters 172 and one AND gate 173. The inserted position of the inverters 172 is determined in a manner similar to the case of the circuit 160. Only when one of the address signals $a_n$ to $a_{n+m-1}$ coincides with the address of the specific memory mat 10, the mat select signal MS having its logic-level "1" appears from the decoder circuit 17.

The switch circuit 14 consists of two N-channel MOSFETs 141 and 142. When the mat enable signal ME is in its logic level "1", the two MOSFETs 141 and 142 are both conducting, so that the voltages $V_{PL}$ and $V_{MP}$ from the circuits 32 and 33 are supplied to the plate P in the memory array 10 and to the data line precharge circuit 111 in the sense circuit 11 respectively. On the other hand, when the signal ME is in its logic level "0", the two MOSFETs 141 and 142 are not conducting, and the voltages $V_{PL}$ and $V_{MP}$ are not supplied.

The switch circuit 15 consists of two NAND gates 151, 153 and one AND gate 152. In the stand-by mode of the memory, both the precharge signal PC and the sense amplifier drive signal SA are in their logic level "0". Therefore, the precharge signal line 114 is in the logic level "1", and the data lines are precharged to the level of the voltage $V_{MP}$ by the precharge circuit 111 connected to the line 114. Also, both an N-channel MOSFET 181 and a P-channel MOSFET 182 in the sense amplifier drive circuit 18 are not conducting, and both sense amplifier driver lines 112 and 113 are precharged by a circuit (not shown). When the memory is placed in the operation mode, both the precharge signal PC and the sense amplifier drive signal SA are now in their logic level "1". When, at this time, both the mat enable signal ME and the mat select signal MS are in their logic level "1", the precharge signal line 114 is in its logic level "0", and the two MOSFETs 181 and 182 conduct. As a result, the power supply potential $V_{cc}$ appears on the sense amplifier driver line 112, and the ground potential appears on the other line 113. Thus, the data line precharge operation is completed, and the sense amplifier 110 is driven. However, no potential change occurs on the lines 112, 113 and 114 when any one of the signals ME and MS is in its logic level "0".

Figure 5:
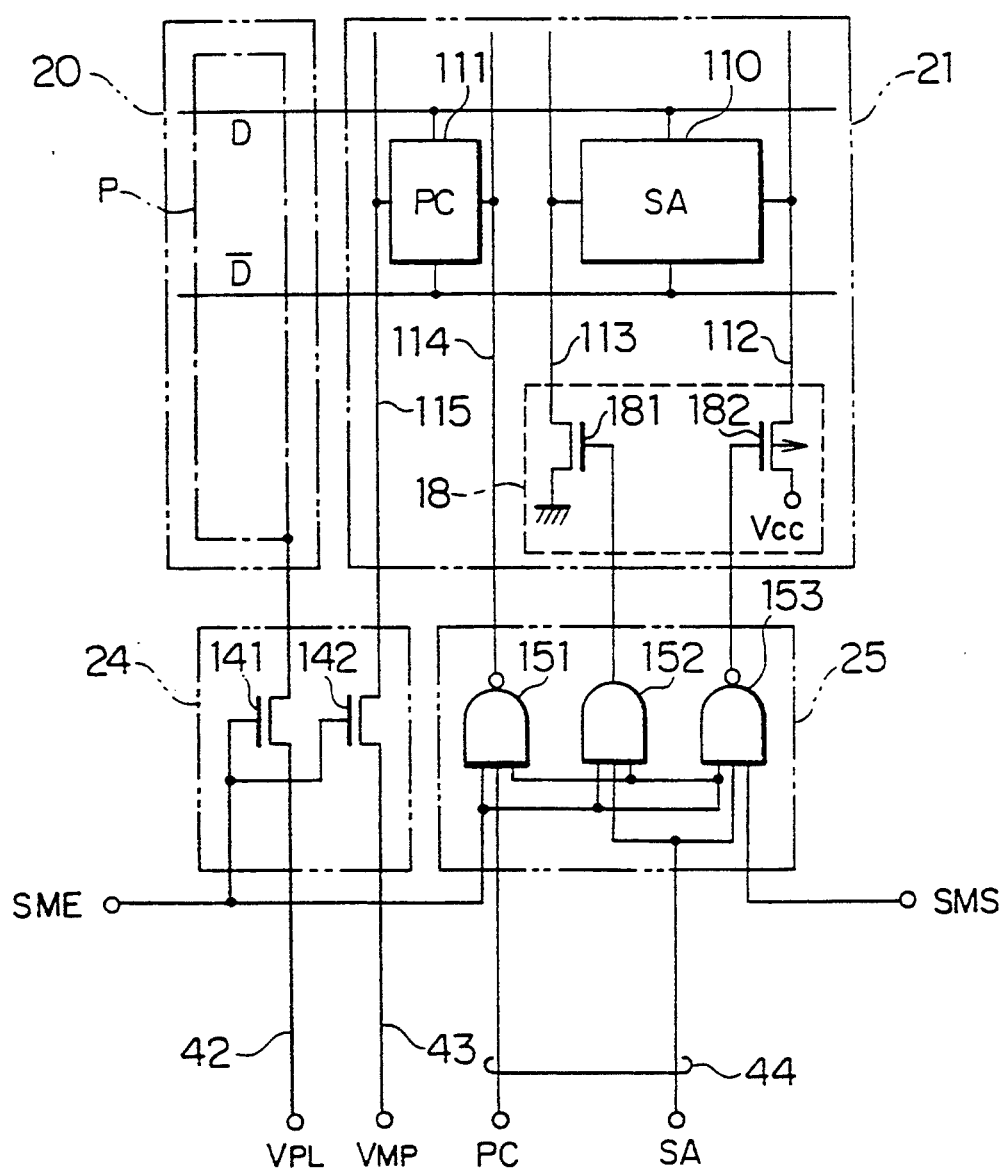

FIG. 5 shows the structures of one form of the switch circuits 24 and 25 associated with the spare memory mat 20. These switch circuits 24 and 25 have the same structures as those of the respective switch circuits 14 and 15 shown in FIG. 4. The only difference is that, in lieu of the signals ME and MS, the switch circuits 24 and 25 are controlled by the spare mat enable signal SME (the output of the ROM 35) and the spare mat select signal SMS (the output of the comparator circuit 36) respectively.

Figure 6:
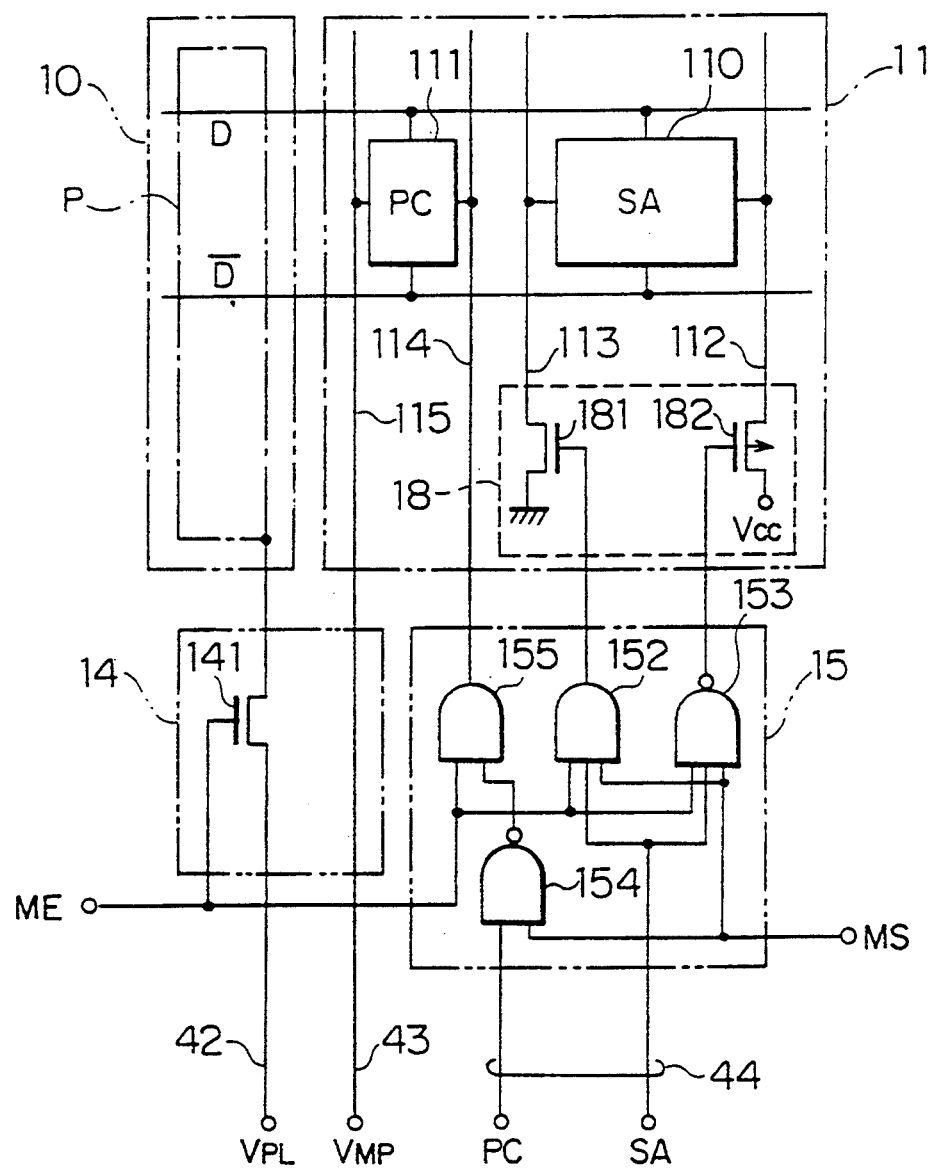

FIG. 6 shows the structures of another form of the switch circuits 14 and 15. In the structures shown in FIG. 6, the precharge circuit 111 is used to stop the supply of the data line precharge voltage $V_{MP}$. For this purpose, the MOSFET 142 is eliminated, and the logic of the switch circuit 15 is altered. When the mat enable signal ME is in its logic level "0", the precharge signal line 114 is always in its logic level "0". Therefore, although the precharge voltage $V_{MP}$ is supplied to the precharge power supply line 115, it is not supplied to the data lines. Of course, the combination of the MOSFET 142 and the precharge circuit 111 can be utilized so as to further reliably stop the supply of the precharge voltage $V_{MP}$.

Figure 7:
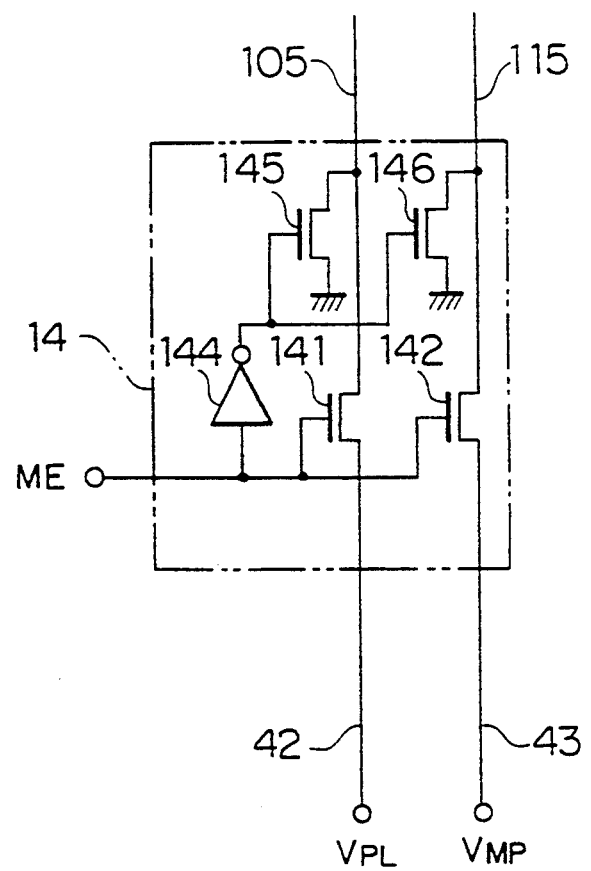

FIG. 7 shows the structure of still another form of the switch circuit 14. In the structure shown in FIG. 7, not only power is not supplied to the lines leading to a defective memory mat, but also the potentials of the lines are fixed. Referring to FIG. 7, when the mat enable signal ME is in its logic level "0", both the MOSFETs 141 and 142 are in their off state, and the plate voltage $V_{PL}$ and the data line precharge voltage $V_{MP}$ are not supplied to the respective lines 105 and 115. On the other hand, an inverter 144 generates its output of logic level "1", and N-channel MOSFETs 145 and 146 are turned on to ground the respective lines 105 and 115. The structure shown in FIG. 7 can prevent the potentials of the lines 105 and 115 from becoming unstable, so that other circuits on the chip may not be adversely affected by noise, etc.

The structures of the decoder circuits and the switch circuits are in no way limited to those shown in FIGS. 4 to 7, and any other logically equivalent circuits may be used.

Figure 11:
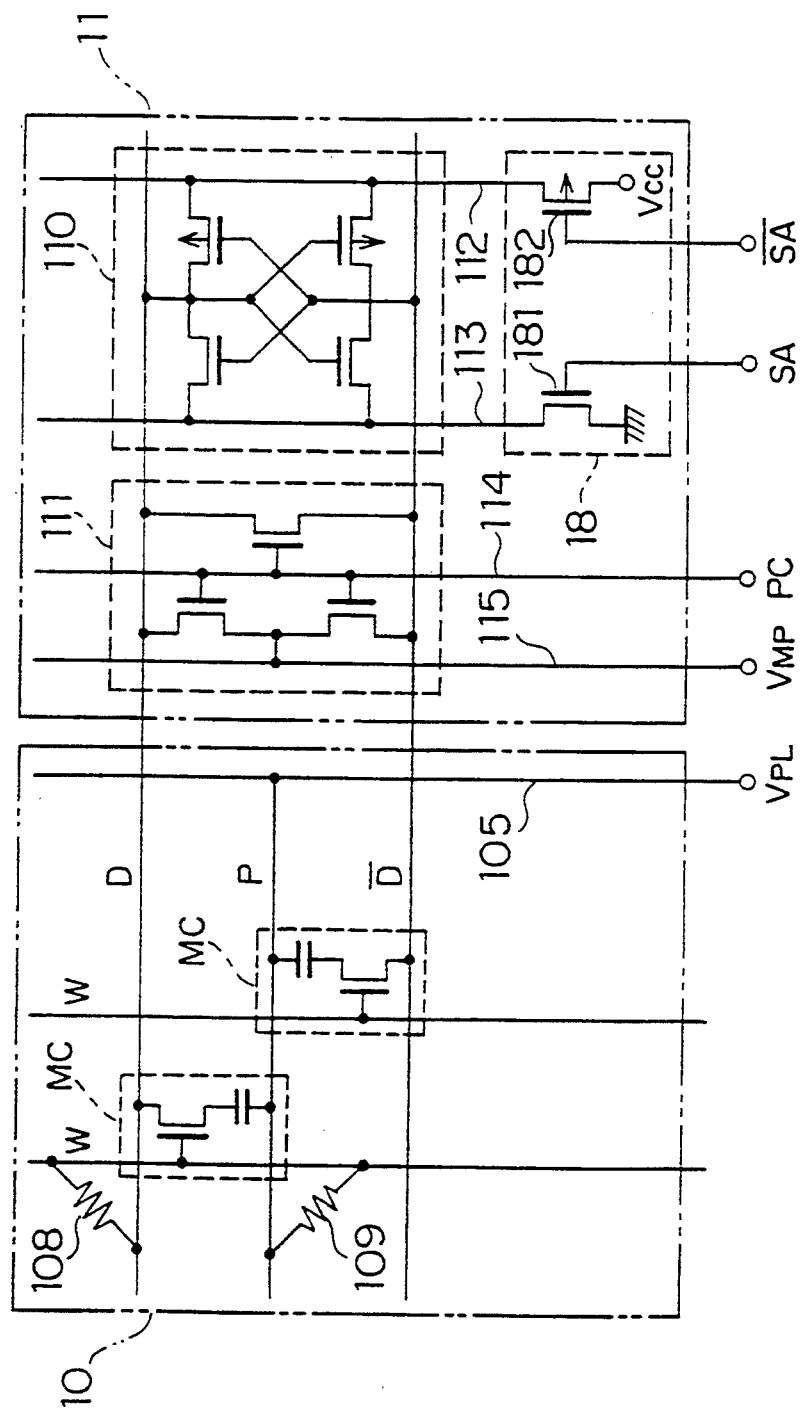
FIG. 11 is a block diagram showing the structure of a prior art semiconductor memory.

The features of the first embodiment of the present invention will now be described. The first feature is that the plate voltage $V_{PL}$ and data line precharge voltage $V_{MP}$ are not supplied to a normal memory mat which is not in use. When a normal memory mat 10 is free from a DC failure, no power is supplied to a spare memory mat 20. On the other hand, when a DC failure is found in the normal memory mat 10, power supply to this normal memory mat 10 is stopped to be supplied to the spare memory mat 20 instead of the former. Thus, the current path to the memory mat 10 having the DC failure (as shown in FIG. 11) can be cut, and the memory mat 10 having the DC failure can be remedied.

The second feature is that, even when the memory is in its stand-by mode, the supply of power from the power supply circuits described above can be switched over. This is because the signals ME and SME controlling the respective switch circuits 14 and 24 acting to switch over the power supply circuits are DC signals. In the prior art redundancy technique, the destination of the signal supply is not switched over before the memory is placed in its operation mode. That is, the signal supply to a defective word line or a defective data line is stopped, and the signal is now supplied to a spare word line or a spare data line. In contrast, in the embodiment of the present invention, the power supply is switched over already even when the memory is in the stand-by mode, so that a DC failure of a memory mat can be remedied even in the stand-by mode of the memory.

The third feature is that the data line precharge signal PC and the sense amplifier drive signal SA are not supplied to a memory mat which is not in use. Thus, wasteful power consumption at the memory mat not in use can be prevented. Although the supply of the signals PC and SA is stopped in the embodiment of the present invention, the supply of any other signals, for example, those used in the row decoder and column decoder may also be stopped.

The fourth feature is that the power and signal change-over described above is controlled by circuits provided on the chip. Therefore, unlike the method proposed in the paper (3) described above, the method of the present invention can also be applied to a general-purpose memory. Further, as shown in FIGS. 2 to 7, the ROM, comparator circuit, decoder circuits and switch circuits can be relatively simply formed, and the increase in the chip area due to the redundancy technique is quite small.

SECOND EMBODIMENT

Figure 8:
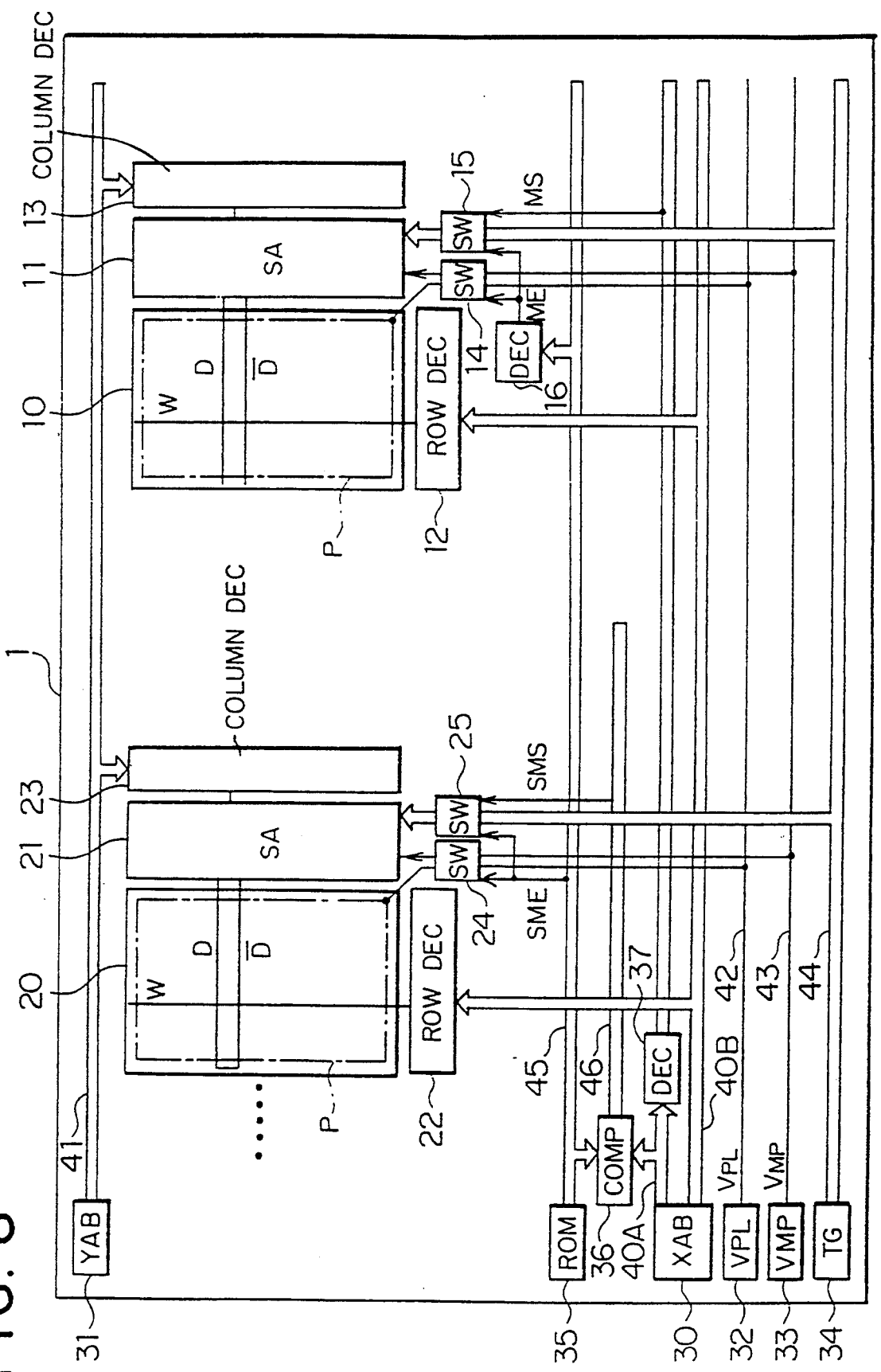
FIGS. 8 and 9 are block diagrams showing the structures of a second and a third embodiment respectively of the semiconductor memory according to the present invention.

FIG. 8 shows the structure of a second embodiment of the present invention. This second embodiment differs from the first embodiment in that a decoder 37 is provided. In the first embodiment shown in FIG. 1, the decoder circuits 17 are distributed to be associated with the respective normal memory mats 10. In the case of this second embodiment, those decoder circuits 17 are assembled into the single decoder 37 which is located near the address buffer 30. The intermat address signal and the normal memory mat select signal MS are the input to and the output from the decoder 37 respectively, and the output is connected to the individual normal memory mats 10.

The feature of this second embodiment is that power consumption due to charge-discharge through signal lines is small. In the case of the first embodiment shown in FIG. 1, the number of the intermat address signal lines 40A is m ($=\log_2 M$), and, in a worst case, charge and discharge occur on all of the m signal lines 40A in one operation cycle of the memory. On the other hand, in the case of the second embodiment shown in FIG. 8, the number of the normal memory mat select signal (MS) lines 47 is M, and charge and discharge occur only one of them in one operation cycle of the memory. Because the signal lines 40A in FIG. 1 and the signal lines 47 in FIG. 8 must be laid over the entire chip, their parasitic capacitance is considerably large. Therefore, in order to reduce the power consumption, the number of charge-discharge signal lines is preferably as small as possible.

The number of the signal lines will now be compared. In the case of the embodiment shown in FIG. 1, the number of the signal lines 40A is m, while in the case of the embodiment shown in FIG. 8, the number of the signal lines 47 is M. Because the relation between m and M is m<M, the embodiment shown in FIG. 1 is preferable from the aspect of the chip area.

THIRD EMBODIMENT

Figure 9:
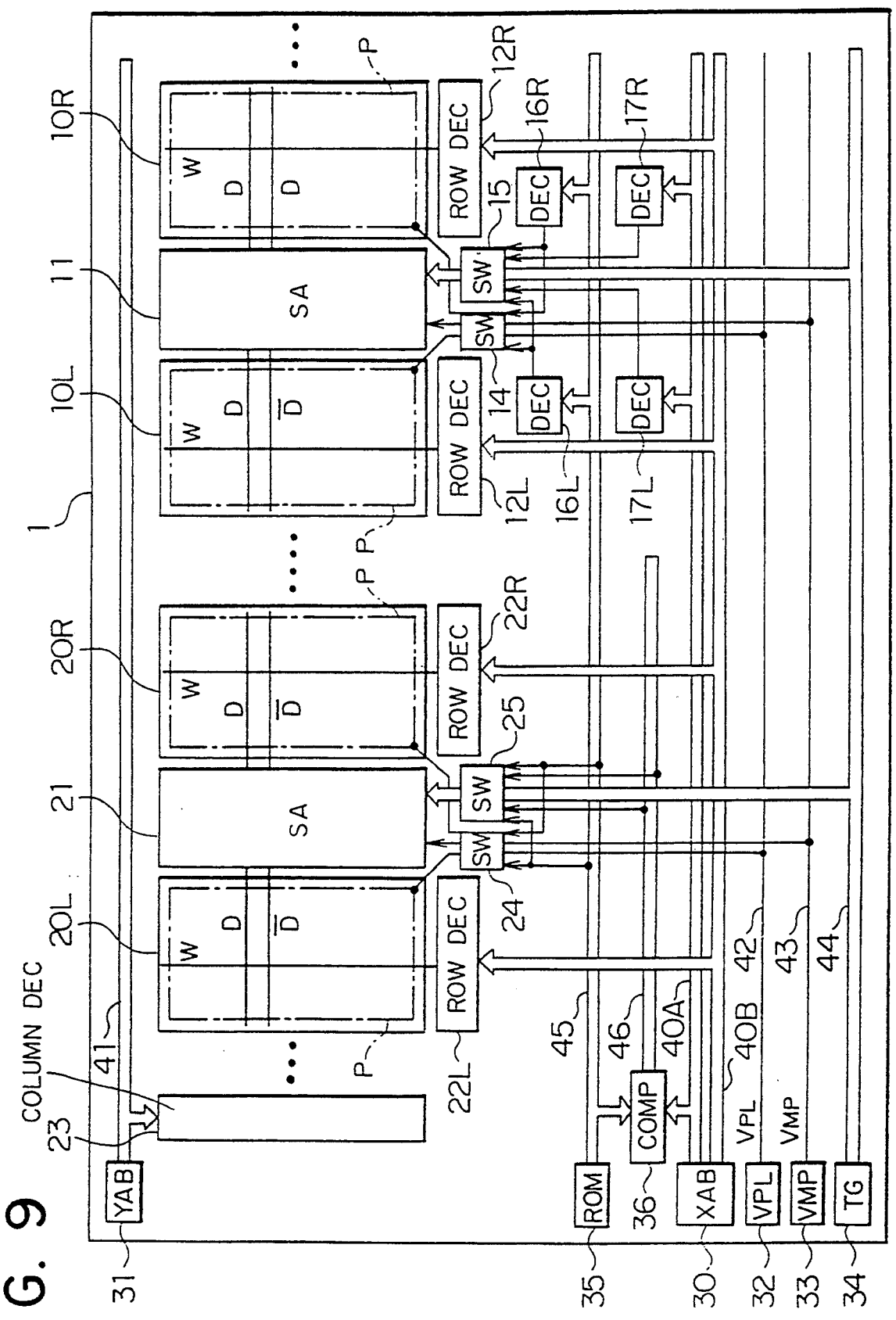

FIG. 9 shows the structure of a third embodiment of the present invention. This third embodiment is also a modification of the first embodiment shown in FIG. 1 and represents application of the present invention to a DRAM of the shared sense and multi-divided data line system. The single column decoder 23 is located adjacent to the marginal edge of the chip, and its output is distributed by lines (not shown) to all of memory mats. The sense circuit 11 is used in common to a left normal memory mat 10L and a right normal memory mat 10R. The sense circuit 21 is also used in common to a left spare memory mat 20L and a right spare memory mat 20R.

FIG. 10 shows the details of the switch circuits 14, 15, and decoder circuits 16L, 17L, 16R, 17R associated with the normal memory mats 10L and 10R in the third embodiment shown in FIG. 9. In FIG. 10, 116L and 116R designate transfer gates for connecting data lines of the respective memory mats 10L and 10R to the sense amplifier 110 and the data line precharge circuit 111. The decoder circuits 16L and 16R generate normal memory mat enable signals ME-L and ME-R for the respective memory mats 10L and 10R. The decoder circuits 17L and 17R generate normal memory mat select signals MS-L and MS-R for the respective normal memory mats 10L and 10R. These circuits 16L, 16R and 17L, 17R have the same structures as those shown in FIG. 4 and are not shown in detail in FIG. 10. The switch circuit 14 supplies power to the memory mats, and the switch circuit 15 supplies signals to the memory mats. The operation of these switch circuits will now be described.

The plate voltage $V_{PL}$ from the circuit 32 is supplied to the memory mat 10L when the memory mat enable signal ME-L is in its logic level "1", and to the memory mat 10R when the memory mat enable signal ME-R is in its logic level "1". The data line precharge voltage $V_{MP}$ from the circuit 33 is supplied through the line 115 to the precharge circuit 111 when any one of the mat enable signals ME-L and ME-R is in its logic level "1". However, as described later, this voltage $V_{MP}$ is not supplied to the data lines of a defective memory mat 10 because, in this case, the signal ME is in its "0" level. The signal supply to the precharge circuit 111 and the sense amplifier 110 is controlled by the four signals ME-L, ME-R, MS-L and MS-R. OR gates 158 and 159 generate the logical sum of the left and right mat enable signals and the logical sum of the left and right mat select signals respectively, thereby controlling the gates 151, 152 and 153. Therefore, when the non-defective one of the left and right memory mats is selected, the data line precharge is ceased, and the sense amplifier 110 is driven.

A timing signal SHR for the transfer gates 116L and 116R is in its logic level "0" when the memory is in its stand-by mode. Therefore, when the transfer gate 116L associated with the memory mat 10L is turned on and off when the mat enable signal ME-L is in its logic level "1" and "0" respectively. The timing signal SHR is turned into its logic level "1" when the memory is placed in the operation mode. Therefore, when the other memory mat 10R is selected because the memory mat enable signal ME-R is in its logic level "1", the transfer gate 116L is turned off. The transfer gate 116L is in its on state when the signal MS-R is in its logic level "0", while the signal ME-L is in its logic level "1". It will be apparent from the above description that the data line precharge voltage $V_{MP}$ is not supplied to the data lines of the memory mat 10L when the mat enable signal ME-L is in its logic level "0". This is because, when the signal ME-L is in its logic level "0", the transfer gate 116L is in its off state in both the stand-by mode and the operation mode of the memory. Thus, the path of current (as shown in FIG. 11) can be cut when a DC failure occurs on the memory mat 10L. While the above description has referred to the memory mat 10L, the same applies to the memory mat 10R.

The structures of the switch circuits 14 and 15 are in no way limited to those shown in FIG. 10, and any other logically equivalent circuits may be used.

All of the embodiments of the present invention described above are of the type where a spare memory mat is substituted for a defective normal memory mat. In a conventional semiconductor memory, substitution of a memory mat as a unit has not been practical. This is because of the number M of memory mats in a prior art semiconductor memory is small, and, when spare memory mats are additionally provided, the redundancy (the ratio R/M between the number R of spare memory mats and that M of normal memory mats) becomes considerably large. However, it is the modern tendency that the number M of memory mats increases with the increase in the integration density of memories, and the number of the memory mats will become as large as 256 to 1024 in semiconductor memories of gigabit class. Therefore, the spare memory mats can be provided without appreciably increasing the redundancy.

The unit of substitution need not necessarily be a physical memory mat. For example, each memory mat may be divided into a plurality of blocks, and this block may be used as a unit of substitution. On the contrary, a plurality of memory mats may be used as a unit of substitution.

It will be understood from the foregoing detailed description of the present invention that a DC failure of a general-purpose memory, which could not be remedied by the prior art redundancy technique, can be efficiently remedied.

What is claimed is:

1. A semiconductor memory comprising:
   a plurality of memory blocks including normal memory blocks and spare memory blocks, each memory block including a plurality of memory cells;
   addressing means for generating address signals for selecting said normal memory blocks;
   a ROM for storing the address of a defective memory block of said normal memory blocks;
   comparing means for comparing the output of said ROM with said address signals;
   a plurality of sense circuits for sensing signals appearing on data lines coupled with said memory cells;
   a plurality of first switch means associated with said plurality of sense circuits each permitting or inhibiting a first DC voltage supply to each of said plurality of sense circuits according to the output of said ROM; and
   a plurality of second switch means associated with said plurality of sense circuits each permitting or inhibiting a control signal supply to each of said plurality of sense circuits according to the output of said ROM,
   wherein at least one of said control signals supplied from said plurality of second switch means activates the associated sense circuit.

2. A semiconductor memory according to claim 1, further comprising:
   third switch means associated with said plurality of memory blocks for permitting or inhibiting a second DC voltage supply to each of said plurality of memory blocks, according to the output of said ROM.

3. A semiconductor memory according to claim 2, further comprising:
   connecting means for connecting or disconnecting one of said plurality of sense circuits with at least one of said plurality of memory blocks, according to the output of said ROM.

4. A semiconductor memory according to claim 3, wherein each of said plurality of sense circuits is associated with a pair of memory blocks from said plurality of memory blocks by a respective one of a plurality of said connecting means.

5. A semiconductor memory according to claim 4, wherein said plurality of connecting means includes a plurality of transfer switches for selectively connecting or disconnecting said plurality of sense circuits, respectively, with corresponding ones of plural pairs of memory blocks from said plurality of memory blocks.

6. A semiconductor memory according to claim 1, further comprising:
   connecting means for connecting or disconnecting one of said plurality of sense circuits with at least one of said plurality of memory blocks, according to the output of said ROM.

7. A semiconductor memory according to claim 6, wherein each of said plurality of sense circuits is associated with a pair of memory blocks from said plurality of memory blocks by a respective one of a plurality of said connecting means.

8. A semiconductor memory according to claim 7, wherein said plurality of connecting means includes a plurality of transfer switches for selectively connecting or disconnecting said plurality of sense circuits, respectively, with corresponding ones of plural pairs of memory blocks from said plurality of memory blocks.

9. A semiconductor memory according to claim 8, further comprising:
   first decoding means for decoding said address signals and for controlling said plurality of second switch means provided for said normal memory blocks.

10. A semiconductor memory according to claim 9, further comprising:

second decoding means for decoding the output of said ROM and for controlling said plurality of first and second switch means provided for said normal memory blocks.

11. A semiconductor memory according to claim 1, further comprising:
first decoding means for decoding said address signals and for controlling said plurality of second switch means provided for said normal memory blocks.

12. A semiconductor memory according to claim 11, further comprising:
second decoding means for decoding the output of said ROM and for controlling said plurality of first and second switch means provided for said normal memory blocks.

13. A semiconductor memory according to claim 12, wherein said normal memory blocks and said spare memory blocks comprise at least one normal memory mat and at least one spare memory mat, respectively.

14. A semiconductor memory according to claim 1, wherein said normal memory blocks and said spare memory blocks comprise at least one normal memory mat and at least one spare memory mat, respectively.

15. A semiconductor memory according to claim 12, wherein said normal memory blocks together comprise plural normal memory mats each of which includes a group of normal memory blocks corresponding to a numerical subdivision of said normal memory blocks.

16. A semiconductor memory according to claim 1, wherein said normal memory blocks together comprise plural normal memory mats each of which includes a group of normal memory blocks corresponding to a numerical subdivision of said normal memory blocks.

17. A semiconductor memory according to claim 15, wherein said spare memory blocks together comprise plural spare memory mats each of which includes a group of spare memory blocks corresponding to a numerical subdivision of said spare memory blocks.

18. A semiconductor memory according to claim 16, wherein said spare memory blocks together comprise plural spare memory mats each of which includes a group of spare memory blocks corresponding to a numerical subdivision of said spare memory blocks.

19. A semiconductor memory according to claim 1, wherein each of said memory cells is a dynamic memory cell of one transistor/one capacitor type, and wherein said plurality of first switch means permits or inhibits at least a data line precharge voltage supply as said first DC voltage supply.

20. A semiconductor memory according to claim 2, wherein each of said memory cells is a dynamic memory cell of one transistor/one capacitor type, and wherein said third switch means permits or inhibits at least a plate voltage supply as said second DC voltage supply.

21. A semiconductor memory according to claim 2, wherein each of said memory cells is a dynamic memory cell of one transistor/one capacitor type, wherein said plurality of first switch means permits or inhibits at least a data line precharge voltage supply as said first DC voltage supply, and wherein said third switch means permits or inhibits at least a plate voltage supply as said second DC voltage supply.

22. A semiconductor memory according to claim 1, wherein each of said memory cells is a dynamic RAM cell comprised of one transistor/one capacitor type.

23. A semiconductor memory according to claim 13, wherein each of said memory cells is a dynamic RAM cell comprised of one transistor/one capacitor type.

* * * * *

UNITED STATES PATENT AND TRADEMARK OFFICE
CERTIFICATE OF CORRECTION

PATENT NO.  : 5,402,376
DATED       : March 28, 1995
INVENTOR(S) : M. Horiguchi, et al.

It is certified that error appears in the above-identified patent and that said Letters Patent is hereby corrected as shown below:

On the title page, left-hand column:

"[*] Notice:  The portion of the term of this patent subsequent to Jul. 16, 2010 has been disclaimed."

should read:

--[*] Notice:  The portion of the term of this patent subsequent to Nov. 16, 2010 has been disclaimed.--

Signed and Sealed this

Seventeenth Day of September, 1996

Attest:

BRUCE LEHMAN

*Attesting Officer*        *Commissioner of Patents and Trademarks*